United States Patent
Mok et al.

(10) Patent No.: US 8,413,006 B1
(45) Date of Patent: Apr. 2, 2013

(54) ERROR DETECTION AND CORRECTION IN DATA AND CONTROL WORDS

(75) Inventors: Winston Ki-Cheong Mok, Vancouver (CA); Steven Scott Gorshe, Beaverton, OR (US); Matthew David Weber, Altoona, WI (US)

(73) Assignees: PMC-Sierra, Inc., Santa Clara, CA (US); Open-Silicon, Inc., Milpitas, CA (US)

( * ) Notice: Subject to any disclaimer, the term of this patent is extended or adjusted under 35 U.S.C. 154(b) by 440 days.

(21) Appl. No.: 12/705,304

(22) Filed: Feb. 12, 2010

(51) Int. Cl.
   *H03M 13/00* (2006.01)
(52) U.S. Cl. ......... 714/752; 714/758; 714/759; 370/252
(58) Field of Classification Search ............... 714/752, 714/758, 759; 370/252
   See application file for complete search history.

(56) References Cited

U.S. PATENT DOCUMENTS

| | | | | |
|---|---|---|---|---|
| 5,077,744 | A * | 12/1991 | Trainer et al. | 714/820 |
| 5,491,700 | A * | 2/1996 | Wright et al. | 714/759 |
| 2005/0207350 | A1 * | 9/2005 | Bloebaum | 370/252 |
| 2009/0313697 | A1 * | 12/2009 | Suvakovic et al. | 726/22 |

* cited by examiner

*Primary Examiner* — Sam Rizk
(74) *Attorney, Agent, or Firm* — Dennis R. Haszko

(57) ABSTRACT

A method and system are provided to detect and correct errors in the Interlaken block code overhead bits. Specifically, a method is provided for determining the original transmitted information with a very high probability of correct interpretation. These approaches can also characterized by their minimal complexity. Further, such a method can operate on the received information in a manner that does not require consideration of special cases. Also, the method does not require the source to send any extra information or alter its current behavior in any way. Thus, the approaches described herein are compatible with all existing Interlaken sources and can provide immediate benefits.

30 Claims, 5 Drawing Sheets

| Field | Bit Position | Function |
|---|---|---|
| Inversion | 66 | Indicates whether bits [63:0] have been inverted to limit the running disparity; 1 = inverted, 0 = not inverted |
| Framing | 65:64 | 64B/67B mechanism to distinguish control and data words; a '01' indicates data, and a '10' indicates control |
| Control | 63 | If set to '1', this is an Idle or Burst Control Word; if '0', this is a Framing Layer Control Word |
| Type | 62 | If set to a '1', the channel number and SOP fields are valid and a data burst follows this control word (a 'Burst Control Word'); if set to a '0', the channel number field and SOP fields are invalid and no data follows this control word (an 'Idle Control Word') |
| SOP | 61 | Start of Packet. If set to a '1', the data burst following this control word represents the start of a data packet; if set to a '0', a data burst that follows this control word is either the middle or end of a packet |
| EOP_Format | 60:57 | This field refers to the data burst preceding this control word. It is encoded as follows:<br>'1xxx' - End-of-Packet, with bits[59:57] defining the number of valid bytes in the last 8-byte word in the burst. Bits[59:57] are encoded such that '000' means 8 bytes valid, '001' means 1 byte valid, etc., with '111' meaning 7 bytes valid; the valid bytes start with bit position [63:56]<br>'0000' - no End-of-Packet, no ERR<br>'0001' - Error and End-of-Packet<br>All other combinations are left undefined. |
| Reset Calendar | 56 | If set to a '1', indicates that the in-band flow control status represents the beginning of the channel calendar |
| In-Band Flow Control | 55:40 | The 1-bit flow control status for the current 16 channels; if set to a '1' the channel is XON, if set to a '0', the channel is XOFF |
| Channel Number | 39:32 | The channel associated with the data burst following this control word; set to all zeroes for Idle Control Words |
| Multiple-Use | 31:24 | This field may serve multiple purposes, depending on the application. If additional channels beyond 256 are required, these 8 bits may be used as a Channel Number Extension, representing the 8 least significant bits of the Channel Number. If additional in-band flow control bits are desired, these bits may be used to represent the flow control status for the 8 channels following the 16 channels represented in bits[55:40]. These bits may also be reserved for application- specific purposes. |
| CRC24 | 23:0 | A CRC error check that covers the previous data burst and this control word |

FIG. 1
PRIOR ART

ERROR DETECTION AND CORRECTION IN DATA AND CONTROL WORDS

FIELD

The present application relates generally to the field of communication protocols. More particularly, the present application relates to a protocol for the detection of errors in data and control words.

BACKGROUND

Errors can occur in the communication of data, whether due to the transmission/reception protocol used, or characteristics of the media or network on which the communication occurs. Various techniques exist to reduce errors in such transmission.

Some existing communication protocols provide only partial error protection for the packet transmitted. For instance, the Interlaken protocol includes cyclic redundancy check (CRC) error detection codes to detect errors only in bits [63:0] of the data words and control words. The Interlaken interface was developed to address some of the shortcomings of existing high-speed, parallel packet-oriented data interfaces such as the IEEE 802.3 XAUI and OIF SPI 4.2.

Interlaken uses a 64B/67B block code structure in which each block contains 64-bits of payload data or control information and 3-bits of block framing information. While bit 63 is separate from the framing bits, it is used as a control bit, to distinguish between an Idle/Burst control word and a Framing Layer Control word. An example of the Interlaken 64B/67B block format for an idle/burst control word is illustrated in FIG. 1.

The CRC-24 used in Interlaken does not cover the framing bits of the data words and idle/burst control words, nor does it cover the framing layer control words. Diagnostic words containing a CRC-32 are transmitted periodically on each lane to detect per-lane errors. The CRC-32 also does not cover the framing bits on that lane.

The information included in the framing bits is used for decoding purposes in order to properly interpret the data included in the payload portion. Therefore, a bit error in the framing bits can result in significant data corruption due to misinterpretation of the packet type, packet format, or whether the packet is inverted. For example, errors can cause data words to be regarded as control words, and vice versa, or could cause the control word type to be misinterpreted.

The Interlaken protocol specification does not describe a method for detecting errors in the framing portion of the word, nor does it specify an appropriate course of action for rectifying or correcting an error when it is detected.

BRIEF DESCRIPTION OF THE DRAWINGS

Embodiments will now be described, by way of example only, with reference to the attached Figures.

FIG. 1 is an example of the Interlaken 64B/67B block format for an idle/burst control word.

DETAILED DESCRIPTION

An embodiment of the present disclosure provides a system and method for detecting and responding to errors in overhead information of a word, for example a word transmitted according to the Interlaken protocol. Further information regarding the Interlaken Protocol, including the Interlaken Protocol Specification, can be found on the website of the Interlaken Alliance.

The convention [i:j] as used herein refers to block bits j through i. For example, the designation for bits 66-63 (i.e., bits 66, 65, 64, and 63) is [66:63].

Specific bit field patterns are designated herein as 0bxx...x, where "0b" indicates that it is a binary pattern and "xx...x" is the specific bit pattern occupying these bits, with the most significant bit (MSB) left justified. For example, in reference to bits [66:63], pattern 0b0101 indicates bit 66=0, bit 65=1, bit 64=0, and bit 63=1.

The term "word" as used herein represents a 67 bit Interlaken word. The terms "framing bits" and "framing portion" are used herein interchangeably to refer to bits [66:64] of the Interlaken word. The terms "information bits" and "information portion" are used herein interchangeably to represent bits [63:0] of the Interlaken word. The terms "overhead information" and "overhead bits" are used herein interchangeably to refer to bits [66:63] of the Interlaken word. The terms "payload bits" and "payload portion" are used herein interchangeably to refer to bits [62:0] of the Interlaken word.

The term "data word" as used herein represents a word that was transmitted with bits [65:64]=01. The term "control word" as used herein represents a word that was transmitted with bits [65:64]=10. The term "Framing Layer Control Word" as used herein represents a control word that was transmitted with bits [66:63]=0100 or 1101. The term "Idle/Burst Control Word" as used herein represents a control word that was transmitted with bits [66:63]=0101 or 1100.

An Interlaken burst is a sequence of words, beginning with a burst control word, followed by one or more data words, and concluding with an idle or burst control word. A packet is made up of one or more Interlaken bursts. Payload represents the portion of a packet or burst containing the information bits of the data words and not containing the idle/burst control words or the framing bits.

Figure 2:
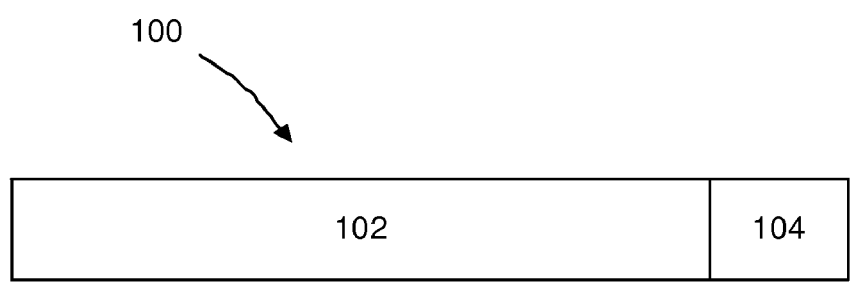
FIG. 2 is a graphical representation of a word format in accordance with the Interlaken protocol, including payload bits and overhead bits.

As described earlier, overhead bits are the collection of framing, control and inversion bits in a transmitted block or word, such as an Interlaken block. FIG. 2 is a graphical representation of a packet or block format 100 in accordance with the Interlaken protocol, including payload bits and overhead bits. In FIG. 2, the payload bits 102 correspond to bits 0-62 in an Interlaken block, and the overhead bits 104 correspond to bits 63-66, which are used for control, framing and inversion.

An advantage of embodiments described herein is the reduction in error multiplication. Without correction, or with a mis-correction, a single bit error can corrupt thousands of bytes. Embodiments described herein seek to eliminate such error multiplication. A typical error correction system helps the error rate by correcting the bits, which improves the performance. Correction of an error in the overhead bits is advantageous for the sake of having the overhead bits interpreted correctly. Embodiments described herein advantageously prevent the multiplication of such an error, which in some cases can prevent disaster depending on the consequences of incorrect interpretation of an errored overhead bit pattern.

In an embodiment, the present disclosure provides a method and system to detect and correct errors in the Interlaken block code overhead bits. Specifically, a method is provided for determining the original transmitted information with a very high probability of correct interpretation. Embodiments described herein can also be characterized by their minimal complexity. Further, a method according to an embodiment operates on the received information in a manner that does not require consideration of special cases. Also, in an embodiment, the method does not require the source to send any extra information or alter its current behavior in any way. Thus, the embodiments described herein are compatible with all existing Interlaken sources and can provide immediate benefits.

In an embodiment, the present application provides a method of correcting bit errors in a word having overhead bits and payload bits, the word being communicated in accordance with a communication protocol. The method includes the following steps: detecting a received overhead bit pattern in the overhead bits; providing an overhead bit correction table, including a plurality of candidate corrective overhead bit patterns, the plurality of candidate corrective overhead bit patterns being based on syntactically valid overhead bit patterns associated with the received overhead bit pattern; selecting, from the overhead bit correction table, a valid candidate corrective overhead bit pattern having a lowest probability of error as a replacement overhead bit pattern; and replacing the received overhead bit pattern with the replacement overhead bit pattern.

The method can further include generating the overhead bit correction table. Generating the overhead bit correction table can include: generating potential candidates for correcting the received overhead bit pattern, the potential candidates including single bit error and error free potential candidates with respect to the received overhead bit pattern; and generating the plurality of candidate corrective overhead bit patterns by eliminating syntactically illegal potential candidates from the generated potential candidates. Generating the potential candidates and generating the plurality of candidate corrective overhead bit patterns can be performed for each possible received overhead bit pattern in the communication protocol.

Selecting the valid corrective overhead bit pattern having the lowest probability of error can include eliminating from consideration semantically invalid candidate corrective overhead bit patterns. The invalid corrective overhead bit patterns can be eliminated from consideration in response to a determination that the received payload bits are unexpected payload bits associated with the received overhead bit pattern. The method can further include comparing the received payload bits to expected valid payload bits associated with the received overhead bit pattern, and determining whether the received payload bits are unexpected payload bits associated with the received overhead bit pattern.

The received word can have associated timing information, and the semantically invalid candidate corrective overhead bit patterns can be eliminated from consideration with respect to unexpected overhead bit patterns for the associated timing information. The semantically invalid candidate corrective overhead bit patterns can be eliminated from consideration with respect to a temporal or spatial neighboring word context. The overhead bits can comprise bits 63, 64, 65 and 66 of an Interlaken interface block.

In another embodiment, the present invention provides an overhead bit correction apparatus to correct bit errors in a packet having overhead bits and payload bits, comprising: an overhead bit pattern detector arranged to detect a received overhead bit pattern in the overhead bits; an overhead bit correction table including a plurality of candidate corrective overhead bit patterns, the candidate corrective overhead bit patterns being based on syntactically valid overhead bit patterns associated with the received overhead bit pattern; a selector arranged to select, from the overhead bit correction table, a valid candidate corrective overhead bit pattern having a lowest probability of error as a replacement overhead bit pattern; and wherein the apparatus is arranged to replace the received overhead bit pattern with the replacement overhead bit pattern.

The apparatus can further include a candidate generator arranged to generate the plurality of candidate corrective overhead bit patterns in the overhead bit correction table. The candidate generator can be arranged to: generate potential candidates for correcting the received overhead bit pattern, the potential candidates including single bit error and error free potential candidates with respect to the received overhead bit pattern; and generate the plurality of candidate corrective overhead bit patterns by eliminating syntactically illegal potential candidates from the generated potential candidates. The candidate generator can be arranged to generate the potential candidates and to generate the plurality of candidate corrective overhead bit patterns for each possible received overhead bit pattern in the communication protocol.

The selector can be arranged to eliminate from consideration semantically invalid candidate corrective overhead bit patterns, as part of selecting the valid corrective overhead bit pattern having the lowest probability of error. The selector can eliminate from consideration the invalid corrective overhead bit patterns in response to a determination that the received payload bits are unexpected payload bits associated with the received overhead bit pattern. The selector can compare the received payload bits to expected valid payload bits associated with the received overhead bit pattern, and determine whether the received payload bits are unexpected payload bits associated with the received overhead bit pattern.

The received word can have associated timing information, and the selector can eliminate the semantically invalid candidate corrective overhead bit patterns from consideration with respect to unexpected overhead bit patterns for the associated timing information. The selector can eliminate the semantically invalid candidate corrective overhead bit patterns from consideration with respect to a temporal or spatial neighboring word context. The overhead bits can comprise bits 63, 64, 65 and 66 of an Interlaken interface block.

The candidate generator can be in communication with a database in order to determine which candidate corrective overhead bit patterns are syntactically valid. The selector can be in communication with a database to assist the selector in selecting the candidate having the least probability of error in the interpretation of payload data. The selector can be in communication with a payload error protection system, and adapted to negotiate therewith in order to select or determine the candidate with the lowest probability of error.

In a further embodiment, the present application provides a method of detecting a single bit error in a packet having overhead bits and payload bits, including the following steps: detecting a received overhead bit pattern in the overhead bits; performing an overhead bit pattern analysis based on the detected overhead bit pattern; and determining, based on a result of the overhead bit pattern analysis, whether a correctable error has occurred in the overhead bits.

Performing the overhead bit pattern analysis can include determining that the received payload bits are unexpected payload bits associated with the received overhead bit pattern. The method can further include comparing the received payload bits to expected valid payload bits associated with the received overhead bit pattern.

Performing the overhead bit pattern analysis can include considering associated timing information with respect to the received overhead bit pattern, or considering a temporal or spatial neighboring word context with respect to the received overhead bit pattern.

The Interlaken interface has become popular for interfaces between high-speed telecommunications ICs and also for network processors. Embodiments described herein can provide an advantage in terms of greater immunity to the impact of signaling or transmission errors, such as bus errors.

The Interlaken standard was intended for data applications such as web surfing, where a request can easily be re-sent if it does not work initially. Embodiments described herein seek to use Interlaken, such as for SONET and OTN-type data, where missing a packet causes the downstream data to be corrupted and/or misinterpreted. Robust solutions should be provided for such applications where retransmission is not an option, for example with a constant bit rate (CBR) data stream. In such environments, it is important to correct errors, whereas for Ethernet traffic it is not an issue, since an error can be fixed by retransmission later on.

As discussed above, some of the existing communication protocols protect only the information bits in a word without providing any error protection for the framing portion which is generally used for decoding purposes in order to properly interpret the data included in the payload portion. A typical example of such protocols is the Interlaken protocol. Therefore, for simplification purposes examples will be described with regard to the Interlaken protocol. However, embodiments of the present disclosure are not limited to the Interlaken protocol, and someone of skill in the art would be able to apply the embodiments described herein to other communication protocols having overhead bits not covered by error correction performed on payload bits. The error protection that is provided by Interlaken and other protocols is error detection only and embodiments described herein provide a method for error correction.

As described previously, the Interlaken packet includes 67 bits divided between information bits of 64 bits [63:0], and a framing portion of 3 bits [66:64]. The format of the framing bits [66:64] in the Interlaken packet is as follows.

Bit 66 indicates whether the payload bits, e.g. bits [63:0], have been inverted to limit the running disparity. When Bit 66=1 then bits [63:0] are inverted. When Bit 66=0 then bits [63:0] are not inverted.

Bits [65:64] are used to distinguish between control and data words in the payload portion of the word When bits [65:64]=[0,1] then the word is a data word. When bits [65:64]=[1,0] then the word is a control word.

Although not part of the three framing bits, bit 63 is used with control words as a control bit to indicate whether the word is an Idle/Burst Control Word (I/BCW) or a Framing Layer Control Word (FLCW). When Bit 63=1 then the word is an Idle/Burst Control Word (I/BCW), otherwise it is a Framing Layer Control Word (FLCW). Bit 63 is protected by the CRC 24 and CRC 32. In an embodiment, bit 63 is used to eliminate invalid candidates and select the correction that has the lowest probability of error, as part of the process of detecting the presence of an error in the framing bits [66:64].

There are different types of control words. The CRC-24 field only comes in on idle/burst control words. The CRC-32 field only comes in on diagnostic framing layer control words. So, if the bit that indicates if it is a data word or a control word is corrupted, or if the bit that indicates if it is an idle/burst control word or a framing layer control word is corrupted, it is unclear whether or not the CRC should be checked.

Due to the manner in which they are used within the Interlaken protocol, not all possible combinations of block code bits 66-63 are used. Further, when the block code carries control information, there are further limitations on the allowed combinations of values in the block code's payload fields.

Using Interlaken's CRC-24, errors in bits [62:0] of a burst control word are correctable, but only if bits [66:63] are correct.

A method according to an embodiment of the present disclosure can be described as follows: check for an anomaly in the overhead bits; respond to the anomaly in a manner that minimizes the probability of incorrect block interpretation; the received bit [66:63] pattern determines which tests the receiver performs on the other block bits, for example based on known restrictions within bits [62:0] of the word, and/or known restrictions on the transmission order of words, and/or known restrictions on the timing of certain types of words. The receiver then makes its decision based on the bit [66:63] values and the results of the associated tests. In an embodiment, checking for an anomaly goes beyond looking only at the overhead bits. In Type 4 cases, for example, there is no anomaly in the overhead bits themselves (0100 is a valid pattern for the overhead bits), but the method still looks for other anomalies, such as: metaframe counter says sync, scram, or diag; payload bits say skip word; or neighboring SERDES lanes say skip word). Further information regarding protocol or control word types can be found on the website of the Interlaken Alliance.

Figure 3:
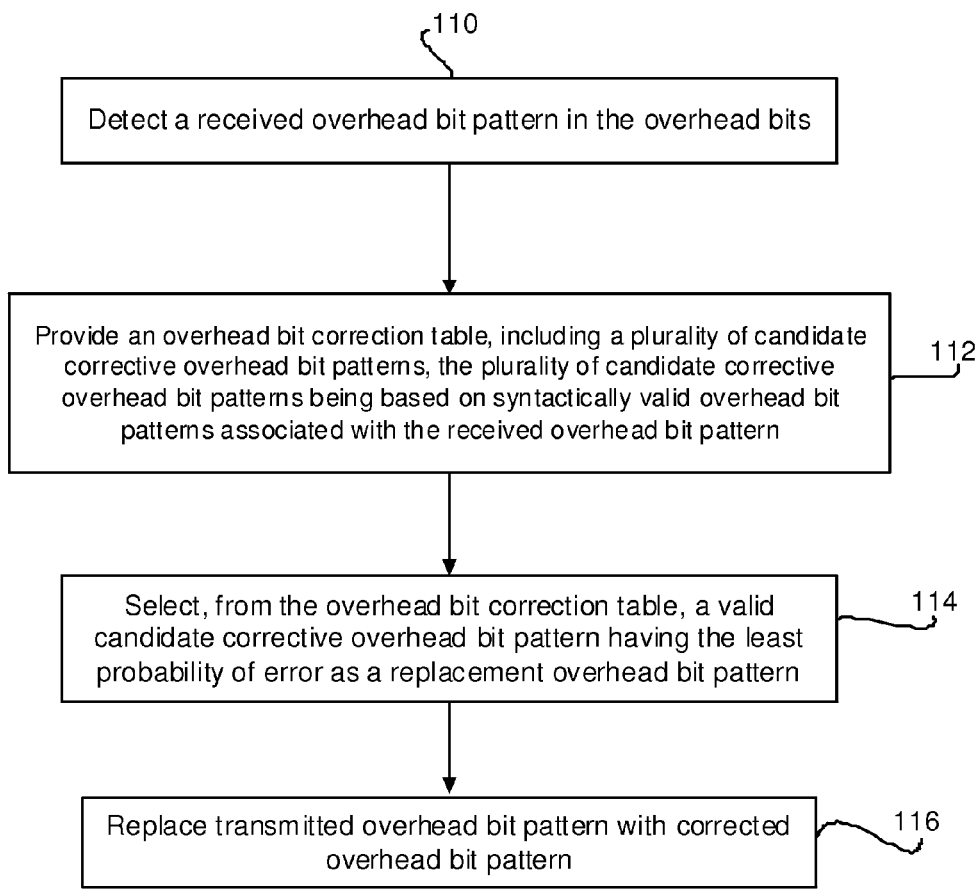
FIG. 3 is a flowchart illustrating a method according to an embodiment of the present disclosure of correcting a bit error in a word having overhead bits and payload bits.

FIG. 3 is a flowchart illustrating a method according to an embodiment of the present disclosure of correcting a single bit error in a packet having overhead bits and payload bits.

The method in FIG. 3 includes the following steps: detecting a received overhead bit pattern in the overhead bits (step 110); providing an overhead bit correction table, including a plurality of candidate corrective overhead bit patterns, the plurality of candidate corrective overhead bit patterns being based on syntactically valid overhead bit patterns associated with the received overhead bit pattern (step 112); selecting, from the overhead bit correction table, a valid candidate corrective overhead bit pattern having a lowest probability of error as a replacement overhead bit pattern (step 114); and replacing the received overhead bit pattern with the selected candidate corrective overhead bit pattern (step 116).

Steps 112-116 can be performed in response to a determination that the received overhead bit pattern is not a valid pattern. The step 116 can be performed regardless of whether the received overhead bit pattern differs from the selected candidate corrective overhead bit pattern.

The method in FIG. 3 can further include generating the overhead bit correction table. Generating the overhead bit correction table can include: generating potential candidates for correcting the received overhead bit pattern, the potential candidates including single bit error and error free potential candidates with respect to the received overhead bit pattern; and generating the plurality of candidate corrective overhead bit patterns by eliminating syntactically invalid, or syntactically illegal, potential candidates from the generated potential candidates. The steps of generating the potential candidates and generating the plurality of candidate corrective overhead bit patterns can be performed for each possible received overhead bit pattern in the communication protocol.

A syntactically invalid candidate corrective overhead bit pattern can be determined in relation to the communication protocol according to which the received word is transmitted. Syntactically valid overhead bit patterns can be valid with respect to that communication protocol. For example, in the Interlaken protocol, framing bits [65:64] should either be [0,1] or [1,0] to indicate a valid interpretation in the payload portion of the packet. Therefore, when candidate's framing bits [66:64] are one of [0,1,1], [1,1,1], [1,0,0] or [0,0,0], then the framing bits form a syntactically invalid pattern and that overhead bit pattern should be omitted from the overhead bit correction table, and not included therein, because bits [65:64] cannot take the values [0,0] and [1,1].

Selecting the valid corrective overhead bit pattern having the lowest probability of error can include eliminating from consideration semantically invalid candidate corrective overhead bit patterns. A semantically invalid pattern, in contrast to a syntactically invalid pattern, is not determined solely in relation to the syntax, or what is valid or legal, for the communication protocol. A determination of semantic validity is performed with regard to the meaning of the received overhead bit pattern, such as in relation to what is expected with respect to timing, neighboring words, and/or the relationship of the payload and overhead bits.

A semantically invalid pattern can occur when the content and/or pattern of the corresponding data fields in the payload portion do not match with what the framing bits indicate. For example, as indicated above with respect to the Interlaken protocol, bits [65:64] indicate whether the information in the payload portion is data information or control information. Furthermore, bits [66] and [63] indicate the inversion and control word type respectively. When bits [66:63]=[0,1,0,0] they indicate that the payload includes framing layer control information. However, if [66:63]=[0,1,0,0] and bits [62:0] or a portion thereof, such as [62:32], do not have the pattern of a framing layer control word then the pattern in the framing portion is semantically illegal, or invalid, and the overhead bit patterns of a framing control word should be eliminated from consideration.

In an embodiment, in order to correct single bit errors in the remainder of a control word [62:0], there has to be a description or an indication of the CRC-24 syndrome matching. The CRC-24 syndrome comes from the payload and is used for types 1, 4, 5, etc). The result of the CRC-24 calculation can be used to determine whether a received overhead bit pattern, or a candidate corrective overhead bit pattern, is semantically valid.

As another example, idle/burst control words include a CRC-24 check code that has been calculated over the control word as well as any preceding data words. When the candidate overhead bit pattern matches that of an idle/burst control word and the CRC-24 check would pass that candidate has a low probability of error. When the candidate overhead bit pattern matches that of an idle/burst control word and the CRC-24 check would fail that candidate has a high probability of error.

For example, for Framing Layer control words, the payload region contains fixed patterns. So, examining those patterns in the payload region provides a very robust way to determine if the candidate proposing to correct the overhead bits be an FLOW is valid or not.

Semantically valid candidate corrective overhead bit patterns can be valid with respect to, or validated against, a neighboring word context, such as a context in which the word is not expected or has no meaning. The neighboring word context can be temporal and include words immediately preceding or following a given word. The neighboring context can be spatial and include words received at the same time as the given word on other lanes. For example, when the previous words include idle control information in the payload portion, and without notice or expectation the framing bits of the next word indicate that the word includes data in the payload portion. A data word without a preceding burst control word does not have a meaning and indicates that there is an error in the interpretation of the data included in the payload. Accordingly, the framing bits form an invalid pattern that should be eliminated and/or replaced.

The neighboring word context can include prior or subsequent words on the same lane of a single or multi-lane interface. The neighboring word context can also include words on other lanes of a multi-lane interface.

As another example, framing layer control words are sent on all lanes of an Interlaken interface at the same time. If a control word is received at a time when other lanes have received a framing layer control word, but an error in bit 66 made it look like a burst control word, it can be determined that it would not be a burst control word since all lanes should have a framing control word. If a corrupted block looks like it is a framing control word, but other lanes have not received a framing control word, then it can be concluded it is a corruption of a burst control word.

The received word can have associated timing information. In that case, in an embodiment, the step of eliminating from consideration semantically invalid candidate corrective overhead bit patterns can include comparing the candidate overhead bit pattern to expected valid overhead bit patterns for the associated timing information. For example, framing control words are sent on a regular basis. If a control word is received at a time when a framing control word is expected, but an error in bit 66 made it look like a burst control word, it can be determined that it would not be a burst control word since at that time a framing control word was expected. If a corrupted block looks like it is a framing control word, but a framing control word is not expected at that time, then it can be concluded it is a corruption of a burst control word.

In another example, if a certain event is scheduled to be performed periodically in the system that interrupts the data momentarily, then last packet received before the starting of the event should indicate that the packet is the end of a burst of code. However, if the framing bits of the next packet indicate that the next packet is a data packet that does not include an end of burst indication then the framing bits form an illegal word that should be eliminated and/or replaced.

Another embodiment includes a look at neighbors plan. Instead of being at a known time on the metaframe counter, the timing is simply that a skip word should occur on all lanes of the interface at the same time on the metaframe counter. It is unknown in advance what the time is, but if it is observed that the neighboring lanes have a skip word, it can be determined that the lane in question should have one also.

The corrected overhead bit pattern can be obtained from the table of candidate corrective overhead bit patterns. Replacing the received overhead bit pattern can be performed using the corrective overhead bit pattern having a lowest probability of error based on content of the payload bits.

Figure 4:
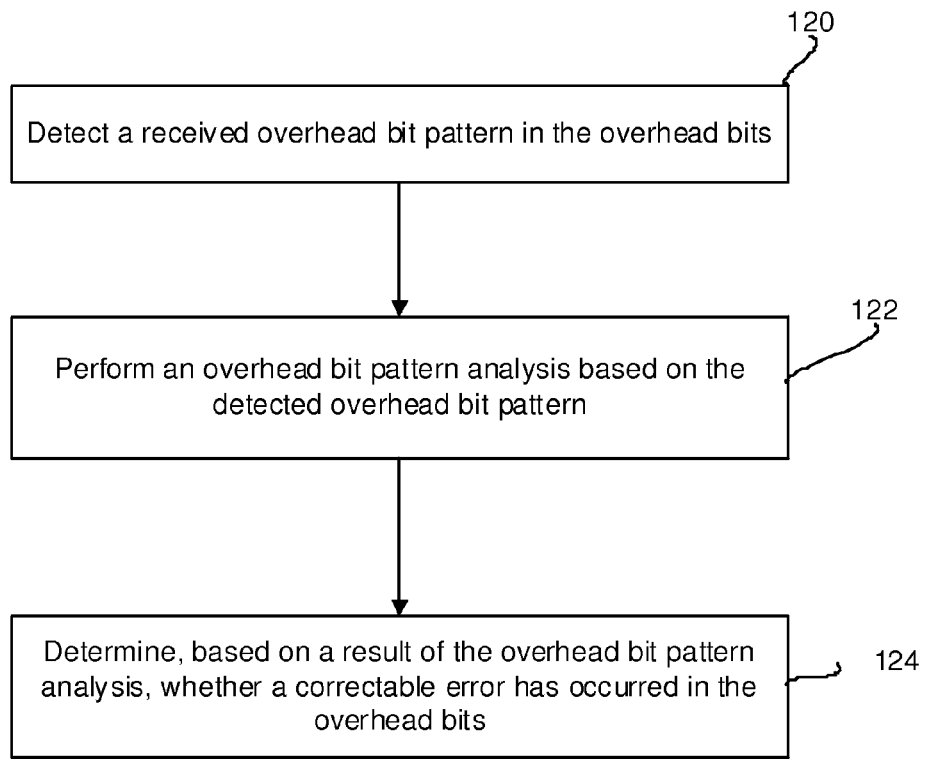
FIG. 4 is a flowchart illustrating a method according to another embodiment of the present disclosure of detecting a bit error in a packet word having overhead bits and payload bits.

FIG. 4 is a flowchart illustrating a method according to another embodiment of the present disclosure of detecting bit errors in a word having overhead bits and payload bits. In addition to being able to detect single bit errors, embodiments described herein can detect and correct some multi-bit error cases. For example when a framing layer control word is corrected based on the timing of the metaframe counter, multiple errors are potentially corrected. Also, there are some single bit errors that are not correctable using embodiments described herein, such as errors in data words (see Table 3 and others).

The method in FIG. 4 includes the following steps: detecting a received overhead bit pattern in the overhead bits (step 120); performing an overhead bit pattern analysis based on the detected overhead bit pattern (step 122); and determining, based on a result of the overhead bit pattern analysis, whether a correctable error has occurred in the overhead bits (step 124).

In an embodiment, the step 122 of performing the overhead bit pattern analysis can include any of the approaches described earlier in relation to FIG. 3 and the exemplary implementation of the steps described therein, such as comparing the received payload bits to expected valid payload bits associated with the received overhead bit pattern. This can determine if the word in the overhead bits is semantically invalid, or illegal, when the content and/or pattern of the corresponding data fields in the payload portion do not match with what the overhead bits indicate.

The invalid corrective overhead bit patterns can be eliminated: with respect to invalid bit combinations in a transmission protocol according to which the received word is transmitted; with respect to one or more neighboring word contexts; or in response to a determination that the payload bits are unexpected payload bits associated with the transmitted overhead bit pattern and/or neighboring word overhead and payload bits. The implementation with the neighboring word overhead and payload bits seeks to capture information using the CRC-24 result to determine the appropriate correction. The received word can have associated timing information; in that case, the invalid corrective overhead bit patterns can be eliminated with respect to unexpected overhead bit patterns for the associated timing information.

There are certain cases in which detection of an error is sufficient and its correction is either not required or not immediately required. In an embodiment, the present disclosure provides a method of detecting bit errors in a word having overhead bits and payload bits. This detection method includes steps 130, 132 and 136, and selectively step 134, in FIG. 4. In the Interlaken interface, the framing bits are not covered by CRC. Therefore, errors in bits 64, 65 and 66 were previously neither detectable nor correctable.

The specific detection criteria and corresponding responses are described as follows. The error scenarios and responses can be categorized by the location of the transmission error.

Scenario 1: An error in framing bit 65 or 64 prevents distinguishing a data word from a control word. Examine payload bits, such as bits [62:32], to determine whether the word can be one of the Framing Layer Control words. Check to see whether the word is in the proper location within the meta-frame for one of the Framing Layer control words. Check neighboring words to determine if they contain Framing Layer Control words. Check bits [23:0] to determine whether it is a valid burst CRC-24. Based on the results of these checks, choose the bit [66:63] values most likely to have been transmitted.

For types 0, 4, 5, etc., using bits [62:32] as described above to determine whether skip is one possible implementation choice according to an embodiment. It is equally valid in other embodiments to use more or fewer of [62:0], which would result in lower or higher probability of incorrect decision.

Scenario 2: An error in bit 63 of a control word can change the meaning of the control word. Use the same techniques as for bits 65 and 64 errors. In addition, check bits [23:0] to determine whether they match the syndrome for a corrupted bit 63. Based on these checks, choose the bit [66:63] values most likely to have been transmitted.

Scenario 3: An error in bit 66 inverts all the data bits, including bit 63. The bit 63 inversion creates the same situation as a bit 63 error. Use the same techniques as for bit 63 errors. Based the results of these checks, choose the bit [66:63] values most likely to have been transmitted.

A key part of the problem is identifying the scenario. In a presently preferred embodiment, all responses are tied to the received bit [66:63] patterns. In other words, the received bit [66:63] pattern determines the type of additional block inspection to be performed. The response is based directly on the combination of the received bit [66:63] pattern inspection results. Since some of the cases can mimic each other, the response with the lowest probability of being incorrect is chosen. For example, the tests associated with the three cases in Table 5 cannot always be distinguished. When they cannot be distinguished, the most probably transmitted value is chosen. The different received patterns in bits [66:63] and the preferred responses are enumerated in Table 1 through Table 16. The tables do not include, as candidates, overhead bit patterns with bits [65:64] having the illegal patterns of [0,0] or [1,1], nor patterns that require more than one error in bits [66:63] to yield the received pattern.

The events of Scenario 1 can be detected by receiving the bit [66:63] patterns shown in Table 1, Table 2, Table 7, Table 8, Table 9, Table 10, Table 15, and Table 16.

The events of Scenario 2 can be detected by receiving the bit [66:63] patterns shown in row 2 of Table 5, row 1 of Table 6, row 3 of Table 11, row 2 of Table 12, row 2 of Table 13, and row 3 of Table 14.

The events of Scenario 3 can be detected by receiving the bit [66:63] patterns shown in row 3 of Table 5, row 3 of Table 6, row 1 of Table 11, row 1 of Table 12, row 1 of Table 13, and row 1 of Table 14.

TABLE 1

Cases resulting in a received 0b0000 pattern in bits [66:63]

| Candidate [66:63] | Intention. | Error Mask | Example checks to perform, selection criteria, and comments |
|---|---|---|---|
| 0b0010 | Non-inverted Data Word | 0b0010 | Method 1: Select candidate 0b0100 if the metaframe counter indicates a Sync, Scrambler, or Diagnostic word is expected Else, select candidate 0b0100 if the payload matches a Skip word Else, select candidate 0b0010 Method 1 has a possibility of mis-correction if transmitted overhead bits were 0b0010, the metaframe counter does not indicate a Sync, Scrambler, or Diagnostic word and the payload bits match a Skip Word. |
| 0b0100 | Non-inverted Framing Layer Control Word | 0b0100 | Method 2: Select candidate 0b0100 if the metaframe counter indicates a Sync, Scrambler, or Diagnostic word is expected Else, select candidate 0b0100 if words on other lanes match a Skip word Else, select candidate 0b0010 Method 2 has no possibility of mis-correction unless multiple bit errors are encountered across the bits being examined. |

TABLE 2

Cases resulting in a received 0b0001 pattern in bits [66:63]

| Candidate [66:63] | Intention | Error Mask | Example checks to perform, selection criteria, and comments |
|---|---|---|---|
| 0b0011 | Non-inverted Data Word | 0b0011 | Select candidate 0b0101 if CRC-24 is correct Else, select candidate 0b0011 |
| 0b0101 | Non-inverted Burst/Idle Control Word | 0b0100 | Possibility of mis-correction if transmitted overhead bits were 0b0011 and the payload bits [23:0] happen to match the correct CRC-24, |

TABLE 3

Cases resulting in a received 0b0010 pattern in bits [66:63]

| Candidate [66:63] | Intention | Error Mask | Example checks to perform, selection criteria, and comments |
|---|---|---|---|
| 0b0010 | Non-inverted Data Word | 0b0000 | No checks are performed and no correction is attempted Select candidate 0b0010 |

TABLE 3-continued

Cases resulting in a received 0b0010 pattern in bits [66:63]

| Candidate [66:63] | Intention | Error Mask | Example checks to perform, selection criteria, and comments |
|---|---|---|---|
| 0b0011 | Non-inverted Data Word | 0b0001 | The received overhead bit pattern is a valid pattern and all candidates correspond to data words |
| 0b1010 | Inverted Data Word | 0b1000 | |

TABLE 4

Cases resulting in a received 0b0011 pattern in bits [66:63]

| Candidate [66:63] | Intention | Error Mask | Example checks to perform, selection criteria, and comments |
|---|---|---|---|
| 0b0010 | Non-inverted Data Word | 0b0001 | No checks are performed and no correction is attempted Select candidate 0b0011 |
| 0b0011 | Non-inverted Data Word | 0b0000 | The received overhead bit pattern is a valid pattern and all candidates correspond to data words |
| 0b1011 | Inverted Data Word | 0b1000 | |

TABLE 5

Cases resulting in a received 0b0100 pattern in bits [66:63]

| Candidate [66:63] | Intention | Error Mask | Example checks to perform, selection criteria, and comments |
|---|---|---|---|
| 0b0100 | Non-inverted Framing Layer Control Word | 0b0000 | Method 1: Select candidate 0b0100 if the metaframe counter indicates a Sync, Scrambler, or Diagnostic word is expected Else, select candidate 0b0100 if the payload matches a Skip word Else, select candidate 0b1100 if CRC-24 yields syndrome of inverted idle/burst control word |
| 0b0101 | Non-inverted Burst/Idle Control Word | 0b0001 | Else, select candidate 0b0101 if CRC-24 yields syndrome of errored bit [63] Else, select candidate 0b0100 Method 1 has a possibility of mis-correction if transmitted overhead bits were 0b0101 or 0b1100, the metaframe counter does not indicate a Sync, Scrambler, or Diagnostic word and the payload bits match a Skip Word. |
| 0b1100 | Inverted Burst/Idle Control Word | 0b1000 | Method 1 has a possibility of mis-correction if the transmitted word was a skip word, the received payload bits do not match a Skip Word (due to one or more bit errors), and the payload bits [23:0] happen to yield the CRC-24 syndrome of and inverted idle/burst control word or an errored bit [63]. Method 2: Select candidate 0b0100 if the metaframe counter indicates a Sync, Scrambler, or Diagnostic word is expected Else, select candidate 0b0100 if words on other lanes match a Skip word Else, select candidate 0b1100 if CRC-24 yields syndrome of inverted idle/burst control word Else, select candidate 0b0101 if CRC-24 yields syndrome of errored bit [63] Else, select candidate 0b0100 Method 2 has no possibility of mis-correction unless multiple bit errors are encountered across the bits being examined. |

TABLE 6

Cases resulting in a received 0b0101 pattern in bits [66:63]

| Candidate [66:63] | Intention | Error Mask | Example checks to perform, selection criteria, and comments |
|---|---|---|---|
| 0b0100 | Non-inverted Framing Layer Control Word | 0b0001 | Method 1: Select candidate 0b0100 if the metaframe counter indicates a Sync, Scrambler, or Diagnostic word is expected Else, select candidate 0b0100 if the payload matches a Skip word Else, select candidate 0b1101 if the payload matches an inverted Skip word |

TABLE 6-continued

Cases resulting in a received 0b0101 pattern in bits [66:63]

| Candidate [66:63] | Intention | Error Mask | Example checks to perform, selection criteria, and comments |
|---|---|---|---|
| 0b0101 | Non-inverted Burst/Idle Control Word | 0b0000 | Else, select candidate 0b0101<br>Method 1 has a possibility of mis-correction if the transmitted overhead bits were 0b1101, and the metaframe counter indicates a Sync, Scrambler, or Diagnostic word is expected. However, even with this mis-correction the word is still correctly identified as a framing layer control word. |
| 0b1101 | Inverted Framing Layer Control Word | 0b1000 | Method 2 :<br>Select candidate 0b0100 if the metaframe counter indicates a Sync, Scrambler, or Diagnostic word is expected<br>Else, select candidate 0b0100 if words on other lanes match a Skip word<br>Else, select candidate 0b0101<br>Method 2 has a possibility of mis-correction if the transmitted overhead bits were 0b1101, and the metaframe counter indicates a Sync, Scrambler, or Diagnostic word is expected or other lanes match a Skip word. However, even with this mis-correction the word is still correctly identified as a framing layer control word. |

TABLE 7

Cases resulting in a received 0b0110 pattern in bits [66:63]

| Candidate [66:63] | Intention | Error Mask | Example checks to perform, selection criteria, and comments |
|---|---|---|---|
| 0b0010 | Non-inverted Data Word | 0b0100 | Method 1 :<br>Select candidate 0b0100 if the metaframe counter indicates a Sync, Scrambler, or Diagnostic word is expected |
| 0b0100 | Non-inverted Framing Layer Control Word | 0b0010 | Else, select candidate 0b0100 if the payload matches a Skip word<br>Else, select candidate 0b0010<br>Method 1 has a possibility of mis-correction if transmitted overhead bits were 0b0010, the metaframe counter does not indicate a Sync, Scrambler, or Diagnostic word and the payload bits match a Skip Word.<br>Method 2 :<br>Select candidate 0b0100 if the metaframe counter indicates a Sync, Scrambler, or Diagnostic word is expected<br>Else, select candidate 0b0100 if words on other lanes match a Skip word<br>Else, select candidate 0b0010<br>Method 2 has no possibility of mis-correction unless multiple bit errors are encountered across the bits being examined. |

TABLE 8

Cases resulting in a received 0b0111 pattern in bits [66:63]

| Candidate [66:63] | Intention | Error Mask | Example checks to perform, selection criteria, and comments |
|---|---|---|---|
| 0b0011 | Non-inverted Data Word | 0b0100 | Select candidate 0b0101 if CRC-24 is correct<br>Else, select candidate 0b0011 |
| 0b0101 | Non-inverted Burst/Idle Control Word | 0b0010 | Possibility of mis-correction if transmitted overhead bits were 0b0011 and the payload bits [23:0] happen to match the correct CRC-24, |

TABLE 9

Cases resulting in a received 0b1000 pattern in bits [66:63]

| Candidate [66:63] | Intention | Error Mask | Example checks to perform, selection criteria, and comments |
|---|---|---|---|
| 0b1010 | Inverted Data Word | 0b0010 | Select candidate 0b1100 if CRC-24 is correct<br>Else, select candidate 0b1010 |
| 0b1100 | Inverted Burst/Idle Control Word | 0b0100 | Possibility of mis-correction if transmitted overhead bits were 0b1010 and the payload bits [23:0] happen to match the correct CRC-24, |

TABLE 10

Cases resulting in a received 0b1001 pattern in bits [66:63]

| Candidate [66:63] | Intention | Error Mask | Example checks to perform, selection criteria, and comments |
|---|---|---|---|
| 0b1011 | Inverted Data Word | 0b0010 | Method 1 :<br>Select candidate 0b1101 if the metaframe counter indicates a Sync, |

TABLE 10-continued

Cases resulting in a received 0b1001 pattern in bits [66:63]

| Candidate [66:63] | Intention | Error Mask | Example checks to perform, selection criteria, and comments |
|---|---|---|---|
| 0b1101 | Inverted Framing Layer Control Word | 0b0100 | Scrambler, or Diagnostic word is expected<br>Else, select candidate 0b1101 if the payload matches an inverted Skip word<br>Else, select candidate 0b1011<br>Method 1 has a possibility of mis-correction if transmitted overhead bits were 0b1011, the metaframe counter does not indicate a Sync, Scrambler, or Diagnostic word and the payload bits match a Skip Word.<br>Method 2 :<br>Select candidate 0b1101 if the metaframe counter indicates a Sync, Scrambler, or Diagnostic word is expected<br>Else, select candidate 0b1101 if words on other lanes match a Skip word or<br>inverted Skip word<br>Else, select candidate 0b1011<br>Method 2 has no possibility of mis-correction unless multiple bit errors are encountered across the bits being examined. |

TABLE 11

Cases resulting in a received 0b1010 pattern in bits [66:63]

| Candidate [66:63] | Intention | Error Mask | Example checks to perform, selection criteria, and comments |
|---|---|---|---|
| 0b0010 | Non-inverted Data Word | 0b1000 | No checks are performed and no correction is attempted<br>Select candidate 0b1010 |
| 0b1010 | Inverted Data Word | 0b0000 | The received overhead bit pattern is a valid pattern and all candidates correspond to data words |
| 0b1011 | Inverted Data Word | 0b0001 | |

TABLE 12

Cases resulting in a received 0b1011 pattern in bits [66:63]

| Candidate [66:63] | Intention | Error Mask | Example checks to perform, selection criteria, and comments |
|---|---|---|---|
| 0b0011 | Non-inverted Data Word | 0b1000 | No checks are performed and no correction is attempted<br>Select candidate 0b1011 |
| 0b1010 | Inverted Data Word | 0b0001 | The received overhead bit pattern is a valid pattern and all candidates correspond to data words |
| 0b1011 | Inverted Data Word | 0b0000 | |

TABLE 13

Cases resulting in a received 0b1100 pattern in bits [66:63]

| Candidate [66:63] | Intention | Error Mask | Example checks to perform, selection criteria, and comments |
|---|---|---|---|
| 0b0100 | Non-inverted Framing Layer Control Word | 0b1000 | Method 1 :<br>Select candidate 0b0100 if the metaframe counter indicates a Sync, Scrambler, or Diagnostic word is expected<br>Else, select candidate 0b0100 if the payload matches a Skip word<br>Else, select candidate 0b1101 if the payload matches an inverted Skip word |
| 0b1101 | Inverted Framing Layer Control Word | 0b0001 | Else, select candidate 0b1100<br>Method 1 has a possibility of mis-correction if the transmitted overhead bits were 0b1101, and the metaframe counter indicates a Sync, Scrambler, or Diagnostic word is expected. However, even with this mis-correction the word is still correctly identified as a framing layer control word. |
| 0b1100 | Inverted Burst/Idle Control Word | 0b0000 | Method 2 :<br>Select candidate 0b0100 if the metaframe counter indicates a Sync, Scrambler, or Diagnostic word is expected<br>Else, select candidate 0b0100 if words on other lanes match a Skip word<br>Else, select candidate 0b1100<br>Method 2 has a possibility of mis-correction if the transmitted overhead bits were 0b1101, and the metaframe counter indicates a Sync, Scrambler, or Diagnostic word is expected or other lanes match a Skip word. However, even with this mis-correction the word is still correctly identified as a framing layer control word. |

TABLE 14

Cases resulting in a received 0b1101 pattern in bits [66:63]

| Candidate [66:63] | Intention | Error Mask | Example checks to perform, selection criteria, and comments |
|---|---|---|---|
| 0b0101 | Non-inverted Burst/Idle Control Word | 0b1000 | Method 1: Select candidate 0b1101 if the metaframe counter indicates a Sync, Scrambler, or Diagnostic word is expected Else, select candidate 0b1101 if the payload matches a Skip word Else, select candidate 0b0101 if CRC-24 yields syndrome of inverted idle/burst control word |
| 0b1101 | Inverted Framing Layer Control Word | 0b0000 | Else, select candidate 0b1100 if CRC-24 yields syndrome of errored bit [63] Else, select candidate 0b1101 Method 1 has a possibility of mis-correction if the transmitted word was a skip word, the received payload bits do not match a Skip Word (due to one |
| 0b1100 | Inverted Burst/Idle Control Word | 0b0001 | or more bit errors), and the payload bits [23:0] happen to yield the CRC-24 syndrome of and inverted idle/burst control word or an errored bit [63]. Method 2: Select candidate 0b1101 if the metaframe counter indicates a Sync, Scrambler, or Diagnostic word is expected Else, select candidate 0b1101 if words on other lanes match a Skip word Else, select candidate 0b0101 if CRC-24 yields syndrome of inverted idle/burst control word Else, select candidate 0b1100 if CRC-24 yields syndrome of errored bit [63] Else, select candidate 0b1101 Method 2 has no possibility of mis-correction unless multiple bit errors are encountered across the bits being examined. |

TABLE 15

Cases resulting in a received 0b1110 pattern in bits [66:63]

| Candidate [66:63] | Intention | Error Mask | Example checks to perform, selection criteria, and comments |
|---|---|---|---|
| 0b1010 | Inverted Data Word | 0b0100 | Select candidate 0b1100 if CRC-24 is correct Else, select candidate 0b1010 |
| 0b1100 | Inverted Burst/Idle Control Word | 0b0010 | Possibility of mis-correction if transmitted overhead bits were 0b1010 and the payload bits [23:0] happen to match the correct CRC-24, |

TABLE 16

Cases resulting in a received 0b1111 pattern in bits [66:63]

| Candidate [66:63] | Intention | Error Mask | Example checks to perform, selection criteria, and comments |
|---|---|---|---|
| 0b1011 | Inverted Data Word | 0b0100 | Method 1: Select candidate 0b1101 if the metaframe counter indicates a Sync, Scrambler, or Diagnostic word is expected Else, select candidate 0b1101 if the payload matches an inverted Skip word |
| 0b1101 | Inverted Framing Layer Control Word | 0b0010 | Else, select candidate 0b1011 Method 1 has a possibility of mis-correction if transmitted overhead bits were 0b1011, the metaframe counter does not indicate a Sync, Scrambler, or Diagnostic word and the payload bits match a Skip Word. Method 2: Select candidate 0b1101 if the metaframe counter indicates a Sync, Scrambler, or Diagnostic word is expected Else, select candidate 0b1101 if words on other lanes match a Skip word or inverted Skip word Else, select candidate 0b1011 Method 2 has no possibility of mis-correction unless multiple bit errors are encountered across the bits being examined. |

In an embodiment, detection and rectification of errors is based solely on the bit pattern of the received word without altering or changing the behavior of the transmitter to implement an error detection scheme. In an embodiment, the pattern and/or content of the data included in the payload portion of the word is used to detect and/or rectify errors in the framing portion of the word, without requesting the transmitter to re-send the word or any further information, and without changing the behavior of the transmitter.

Figure 5:
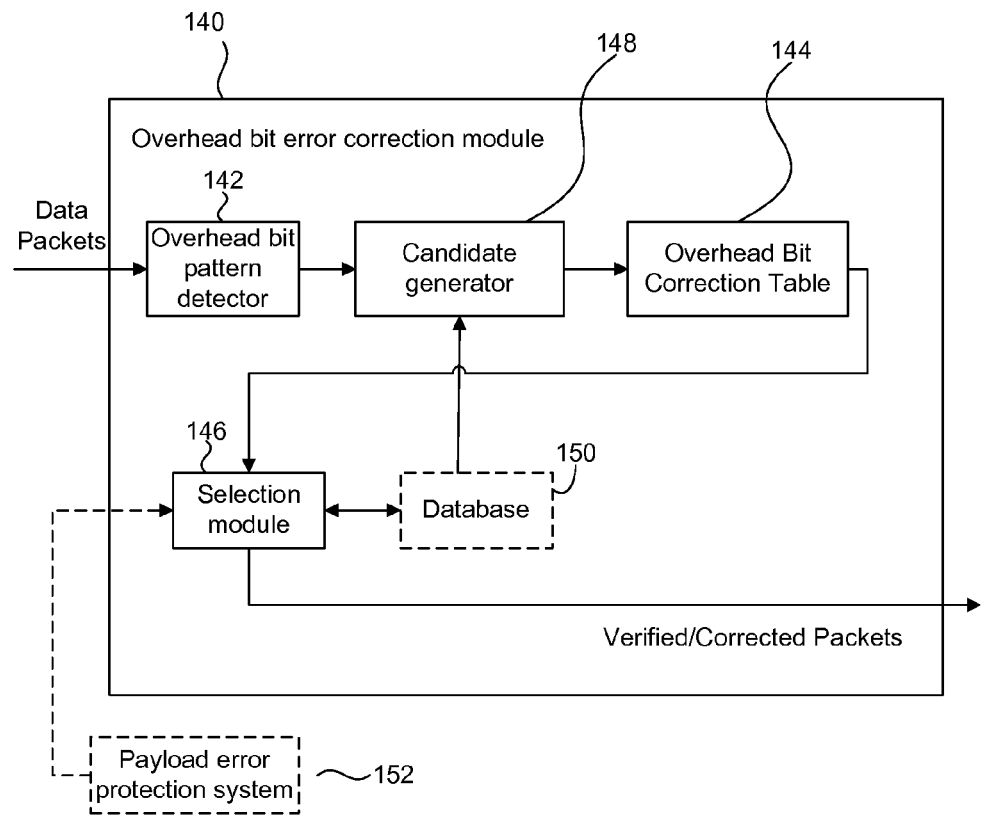
FIG. 5 illustrates an error correction apparatus according to an embodiment of the present application for correcting a single bit error in a word having overhead bits and payload bits.

FIG. 5 illustrates an error correction apparatus according to an embodiment of the present application for correcting bit errors in a word having overhead bits and payload bits. The apparatus can be implemented as an overhead bit error correction module 140, and can also be used to only perform error detection.

The error correction module, or error correction circuit, 140 receives data in the form of words. An overhead bit detector 142 detects a received overhead bit pattern in the overhead bits. In an Interlaken block, the overhead bit pattern comprises the pattern of bits [66:63]. The detector 142 can also be used to copy or extract the overhead bits from the word.

An overhead bit correction table 144 includes a plurality of candidate corrective overhead bit patterns. The candidate corrective overhead bit patterns are based on syntactically valid overhead bit patterns associated with the received overhead bit pattern.

A selector, or selection module, 146 selects from the overhead bit correction table 144, a valid candidate corrective overhead bit pattern having a lowest probability of error as a replacement overhead bit pattern. The selector 146 can replace the transmitted overhead bit pattern with the replacement overhead bit pattern. The replacement can be in response to a determination that the received overhead bit pattern differs from the selected candidate corrective overhead bit pattern. Alternatively, the replacement can be performed by another module or circuit within the overhead bit error correction module 140.

A candidate generator 148 can be provided to generate the plurality of candidate corrective overhead bit patterns in the overhead bit correction table 144. For example, the candidate generator 148 can be arranged to: generate potential candidates for correcting the received overhead bit pattern, the potential candidates including single bit error and error free potential candidates with respect to the received overhead bit pattern; and generate the plurality of candidate corrective overhead bit patterns by eliminating syntactically illegal potential candidates from the generated potential candidates. The steps of generating the potential candidates and generating the plurality of candidate corrective overhead bit patterns can be performed for each possible received overhead bit pattern in the communication protocol.

In an embodiment, the candidate generator 148 is in communication with a database 150 in order to determine which candidate corrective overhead bit patterns are syntactically valid, or syntactically legal, and should be included in the overhead bit correction table 144. The database 150 can include stored information for determining which candidates are syntactically valid and/or expected, and which are not, such as described earlier.

The selector 146 can also be in communication with the database 150, to assist the selector in selecting the candidate having the least probability of error in the interpretation of payload data. In selecting the appropriate candidate, the selection module 148 accesses the database 150 which can store a probability of error for each of the candidates produced by the candidate generator 144. The probability of error for each candidate can be mathematically generated and stored in the database 150.

In an embodiment, the selector 148 is arranged and/or programmed to automatically select the candidate with the lowest probability of error. This probability is the probability that the selected error was the incorrect selection. In an embodiment, when the selector 148 encounters at least two candidates having the same probability of error, the selector 148 can be pre-programmed to select one of the candidates in accordance with a stored priority indicator for the candidate. In another embodiment, the selector 148 can be pre-programmed to select one of the at least two candidates having the same probability of error according to a stored system setting, or simply randomly.

The selector 146 can be arranged to eliminate from consideration semantically invalid candidate corrective overhead bit patterns during the process of selecting the valid corrective overhead bit pattern having the lowest probability of error. The database 150 can include stored information for determining which candidates are semantically valid and/or expected, and which are not. For example, the database 150 can include rules and tests to apply to the candidates as described earlier such as in relation to FIGS. 3 and 4.

In an embodiment, the selector 146 is in communication with a payload error protection system 152, and adapted to negotiate therewith. The payload error protection system 152 protects the payload portion of the packet. For example, in the Interlaken protocol, CRC protects the 64 bits [63:0] of the payload portion but does not protect the framing bits [66:63]. Therefore, the CRC is the payload error protection system 152.

The error detection and correction module 140 can negotiate with CRC in order to select or determine the candidate with the lowest probability of error. For example, CRC can provide suggestions for correcting errors in the 64 bits of payload data. These suggestions can be compared with the valid candidates provided to the selection module 146 to determine if the changes suggested by the CRC provide a better match with the remaining valid candidate corrective overhead bit patterns available at the selection module 146. Such negotiation between the error detection and correction module 140 and the payload error protection system 152 can be performed in parallel with the other measures described herein to further reduce the possibility of error in the packet.

The Interlaken interface is growing in importance. Although the consequences of certain types of errors can be severe, the Interlaken protocol includes a very incomplete set of error detection or correction capabilities for packet data clients. Providing the error correction capabilities according to embodiments described herein adds great value to an Interlaken interface implementation by greatly increasing its robustness, particularly for constant bit rate client streams. Increased robustness also can provide increased throughput for packet data clients.

In the preceding description, for purposes of explanation, numerous details are set forth in order to provide a thorough understanding of the embodiments described herein. However, it will be apparent to one skilled in the art that these specific details are not required in order to practice the embodiments. In other instances, well-known electrical structures and circuits are shown in block diagram form in order not to obscure the embodiments. For example, specific details are not provided as to whether the embodiments described herein are implemented as a software routine, hardware circuit, firmware, or a combination thereof.

Embodiments described herein can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment described herein. Those of ordinary skill in the art will appreciate that other instructions and operations necessary to implement the described embodiments can also be stored on the machine-readable medium. Software running from the machine-readable medium can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of correcting bit errors in a word having overhead bits and payload bits, the word being communicated in accordance with a communication protocol, the method comprising:
   detecting a received overhead bit pattern in the overhead bits;
   providing an overhead bit correction table, including a plurality of candidate corrective overhead bit patterns, the plurality of candidate corrective overhead bit patterns being based on syntactically valid overhead bit patterns associated with the received overhead bit pattern;
   selecting, from the overhead bit correction table, a valid candidate corrective overhead bit pattern having a lowest probability of error as a replacement overhead bit pattern; and
   replacing the received overhead bit pattern with the replacement overhead bit pattern.

2. The method of claim 1 further comprising generating the overhead bit correction table.

3. The method of claim 2 wherein generating the overhead bit correction table comprises:
   generating potential candidates for correcting the received overhead bit pattern, the potential candidates including single bit error and error free potential candidates with respect to the received overhead bit pattern; and
   generating the plurality of candidate corrective overhead bit patterns by eliminating syntactically illegal potential candidates from the generated potential candidates.

4. The method of claim 3 wherein generating the potential candidates and generating the plurality of candidate corrective overhead bit patterns are performed for each possible received overhead bit pattern in the communication protocol.

5. The method of claim 1 wherein selecting the valid corrective overhead bit pattern having the lowest probability of error comprises eliminating from consideration semantically invalid candidate corrective overhead bit patterns.

6. The method of claim 5 wherein the invalid corrective overhead bit patterns are eliminated from consideration in response to a determination that the received payload bits are unexpected payload bits with respect to the received overhead bit pattern.

7. The method of claim 6 further comprising comparing the received payload bits to expected valid payload bits associated with the received overhead bit pattern, and determining whether the received payload bits are unexpected payload bits with respect to the received overhead bit pattern.

8. The method of claim 5 wherein the received word has associated timing information, and wherein the semantically invalid candidate corrective overhead bit patterns are eliminated from consideration with respect to unexpected overhead bit patterns for the associated timing information.

9. The method of claim 5 wherein the semantically invalid candidate corrective overhead bit patterns are eliminated from consideration with respect to a temporal neighboring word context.

10. The method of claim 5 wherein the semantically invalid candidate corrective overhead bit patterns are eliminated from consideration with respect to a spatial neighboring word context.

11. The method of claim 1 wherein the overhead bits comprise bits 63, 64, 65 and 66 of an Interlaken interface block.

12. An overhead bit correction apparatus to correct bit errors in a packet having overhead bits and payload bits, comprising:
   an overhead bit pattern detector arranged to detect a received overhead bit pattern in the overhead bits;
   an overhead bit correction table including a plurality of candidate corrective overhead bit patterns, the candidate corrective overhead bit patterns being based on syntactically valid overhead bit patterns associated with the received overhead bit pattern;
   a selector arranged to select, from the overhead bit correction table, a valid candidate corrective overhead bit pattern having a lowest probability of error as a replacement overhead bit pattern; and
   wherein the apparatus is arranged to replace the received overhead bit pattern with the replacement overhead bit pattern.

13. The apparatus of claim 12 further comprising a candidate generator arranged to generate the plurality of candidate corrective overhead bit patterns in the overhead bit correction table.

14. The apparatus of claim 13 wherein the candidate generator is arranged to:
   generate potential candidates for correcting the received overhead bit pattern, the potential candidates including single bit error and error free potential candidates with respect to the received overhead bit pattern; and
   generate the plurality of candidate corrective overhead bit patterns by eliminating syntactically illegal potential candidates from the generated potential candidates.

15. The apparatus of claim 13 wherein the candidate generator is arranged to generate the potential candidates and to generate the plurality of candidate corrective overhead bit patterns for each possible received overhead bit pattern in the communication protocol.

16. The apparatus of claim 13 wherein the candidate generator is in communication with a database in order to determine which candidate corrective overhead bit patterns are syntactically valid.

17. The apparatus of claim 12 wherein the selector is arranged to eliminate from consideration semantically invalid candidate corrective overhead bit patterns, as part of selecting the valid corrective overhead bit pattern having the lowest probability of error.

18. The apparatus of claim 17 wherein the selector eliminates from consideration the invalid corrective overhead bit patterns in response to a determination that the received payload bits are unexpected payload bits with respect to the received overhead bit pattern.

19. The apparatus of claim 18 wherein the selector compares the received payload bits to expected valid payload bits associated with the received overhead bit pattern, and determines whether the received payload bits are unexpected payload bits with respect to the received overhead bit pattern.

20. The apparatus of claim 17 wherein the received word has associated timing information, and wherein the selector eliminates the semantically invalid candidate corrective overhead bit patterns from consideration with respect to unexpected overhead bit patterns for the associated timing information.

21. The apparatus of claim 17 wherein the selector eliminates the semantically invalid candidate corrective overhead bit patterns from consideration with respect to a temporal neighboring word context.

22. The apparatus of claim 17 wherein the selector eliminates the semantically invalid candidate corrective overhead bit patterns from consideration with respect to a spatial neighboring word context.

23. The apparatus of claim 12 wherein the overhead bits comprise bits 63, 64, 65 and 66 of an Interlaken interface block.

24. The apparatus of claim 12 wherein the selector is in communication with a database to assist the selector in selecting the candidate having the least probability of error in the interpretation of payload data.

25. The apparatus of claim 12 wherein the selector is in communication with a payload error protection system, and adapted to negotiate therewith in order to select or determine the candidate with the lowest probability of error.

26. A method of detecting a single bit error in a packet having overhead bits and payload bits, comprising:

detecting a received overhead bit pattern in the overhead bits;

performing an overhead bit pattern analysis based on the detected overhead bit pattern;

determining, based on a result of the overhead bit pattern analysis, whether a correctable error has occurred in the overhead bits;

determining that the received payload bits are unexpected payload bits with respect to the received overhead bit pattern.

27. The method of claim 26 further comprising comparing the received payload bits to expected valid payload bits associated with the received overhead bit pattern.

28. The method of claim 26 wherein performing the overhead bit pattern analysis comprises considering associated timing information with respect to the received overhead bit pattern.

29. The method of claim 26 wherein performing the overhead bit pattern analysis comprises considering a temporal neighboring word context with respect to the received overhead bit pattern.

30. The method of claim 26 wherein performing the overhead bit pattern analysis comprises considering a spatial neighboring word context with respect to the received overhead bit pattern.

* * * * *